(12) United States Patent
Mack et al.

(10) Patent No.: US 8,499,361 B2
(45) Date of Patent: Jul. 30, 2013

(54) PROTOTYPING STATION FOR ATOMIC FORCE MICROSCOPE-ASSISTED DEPOSITION OF NANOSTRUCTURES

(75) Inventors: James F. Mack, Palo Alto, CA (US); Neil Dasgupta, Menlo Park, CA (US); Timothy P. Holme, Menlo Park, CA (US); Friedrich B. Prinz, Woodside, CA (US); Andrei Iancu, Stanford, CA (US); Wonyoung Lee, Stanford, CA (US)

(73) Assignees: The Board of Trustees of the Leland Stanford Junior University, Palo Alto, CA (US); Honda Motor Co., Ltd, Tokyo (JP)

( * ) Notice: Subject to any disclaimer, the term of this patent is extended or adjusted under 35 U.S.C. 154(b) by 0 days.

(21) Appl. No.: 13/548,845

(22) Filed: Jul. 13, 2012

(65) Prior Publication Data
US 2012/0284882 A1 Nov. 8, 2012

Related U.S. Application Data (63) Continuation of application No. 12/383,467, filed on Mar. 23, 2009, now Pat. No. 8,296,859.

(51) Int. Cl.
*H01J 37/06* (2006.01)

(52) U.S. Cl.
USPC .................. 850/21; 850/26; 73/105

(58) Field of Classification Search
USPC ........................................... 850/21
See application file for complete search history.

(56) References Cited

U.S. PATENT DOCUMENTS

| | | | | |
|---|---|---|---|---|
| RE37,560 | E * | 2/2002 | Elings ........................ | 310/316.01 |
| 7,076,996 | B2 * | 7/2006 | Markakis et al. .............. | 73/105 |
| 7,111,504 | B2 * | 9/2006 | Blumberg et al. ............. | 73/105 |
| 7,735,147 | B2 * | 6/2010 | Jin et al. ........................ | 850/21 |
| 7,818,816 | B1 * | 10/2010 | Reppert et al. .................... | 850/1 |

* cited by examiner

*Primary Examiner* — Phillip A Johnston
(74) *Attorney, Agent, or Firm* — Lumen Patent Firm (57) ABSTRACT

A localized nanostructure growth apparatus that has a partitioned chamber is provided, where a first partition includes a scanning probe microscope (SPM) and a second partition includes an atomic layer deposition (ALD) chamber, where the first partition is hermetically isolated from the second partition, and at least one SPM probe tip of the SPM is disposed proximal to a sample in the ALD chamber. According to the invention, the hermetic isolation between the chambers prevents precursor vapor from damaging critical microscope components and ensuring that contaminants in the ALD chamber can be minimized.

14 Claims, 5 Drawing Sheets

PROTOTYPING STATION FOR ATOMIC FORCE MICROSCOPE-ASSISTED DEPOSITION OF NANOSTRUCTURES

CROSS-REFERENCE TO RELATED APPLICATIONS

This application is a continuation of U.S. patent application Ser. No. 12/383,467 filed Mar. 23, 2009, now U.S. Pat. No. 8,296,859 which is incorporated herein by reference.

FIELD OF THE INVENTION

The invention relates generally to a thin film deposition apparatus. More particularly, the invention relates to a localized nanostructure growth apparatus having a partitioned chamber.

BACKGROUND OF THE INVENTION

Biased scanning probe microscope (SPM) tips used to trigger deposition has been investigated for a number of years. Some applications involved oxidation of silicon for oxide tunneling barriers, while other applications relate to localized growth of metal structures using a scanning tunneling microscope (STM) tip to decompose chemical vapor deposition (CVD) precursors. Some of the metals deposited include aluminum, platinum and gold, rhodium, and iron.

Quantum dot structures have been fabricated with SPM lithography techniques, however such structures have not been integrated into working devices, where real-time characterization is necessary. One key issue is ensuring that contaminants in the ALD chamber can be minimized, and preventing precursor vapor from damaging critical microscope components.

What is needed is a nanostructure growth apparatus that has a partitioned chamber, where a first partition houses a scanning probe microscope (SPM) and the second partition is an atomic layer deposition (ALD) chamber to preventing precursor vapor from damaging critical microscope components and ensuring that contaminants in the ALD chamber can be minimized.

SUMMARY OF THE INVENTION

To address the needs in the art, a scanning probe microscope (SPM) isolation device is provided that includes a partitioned chamber, where a first partition has a SPM located above a second partition, where the first partition is hermetically isolated from the second partition, where a SPM probe tip of the SPM is disposed in the second partition, where a remaining portion of the SPM is disposed in the first partition that is hermetically isolated from the second partition.

According to one aspect of the invention, the SPM includes an atomic force microscope or a scanning tunneling microscope.

In another aspect of the invention, a network analyzer is disposed to provide dielectric imaging and capacitive tip height sensing to the SPM probe tip.

In a further aspect of the invention, the SPM probe tip has a wire disposed on the SPM probe tip, where the wire has a diameter up to 200 nm.

According to another aspect of the invention, the SPM probe tip has a linear array of SPM probe tips, where the linear array is disposed on a single cantilever. In one aspect the invention further includes a switch disposed to address one of the probe tips in the array.

In one aspect of the invention, the probe tip includes a catalyst coating.

In yet another aspect of the invention, the probe tip includes a ceramic insulating film.

In a further aspect of the invention, the SPM isolation device is mounted in an acoustic isolation structure.

According to one aspect of the invention, the SPM isolation device is mounted on a vibration damping structure.

In another aspect of the invention, the SPM isolation device comprises a pump that is free of moving parts.

In another aspect of the invention, the SPM isolation device includes a function generator, a pulse generator, or another device which generates voltage waveforms and pulses that provides predefined voltage pulses to the SPM probe tip.

In yet another aspect of the invention, the SPM probe tip includes a conductive metal layer disposed between two insulating layers.

In a further aspect of the invention, the SPM accesses the second partition through a gas impermeable barrier disposed between the partitions.

In yet another aspect of the invention, the device includes an in-situ optical measurement path to the SPM probe tip.

BRIEF DESCRIPTION OF THE DRAWING

The objectives and advantages of the present invention will be understood by reading the following detailed description in conjunction with the drawing, in which.

DETAILED DESCRIPTION

Although the following detailed description contains many specifics for the purposes of illustration, anyone of ordinary skill in the art will readily appreciate that many variations and alterations to the following exemplary details are within the scope of the invention. Accordingly, the following preferred embodiment of the invention is set forth without any loss of generality to, and without imposing limitations upon, the claimed invention.

Figure 1:
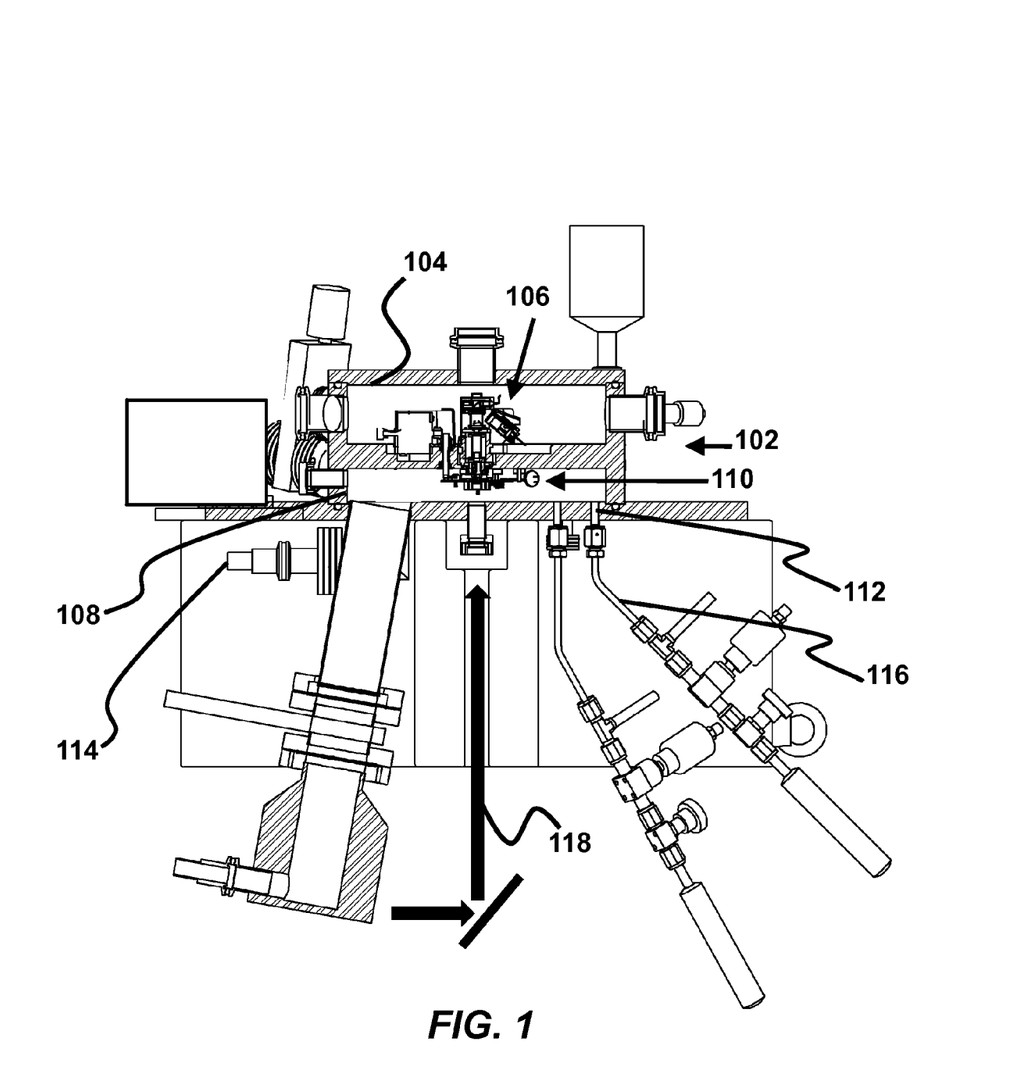
FIG. 1 shows a planar cutaway view of an integrated nanostructure growth apparatus according to the present invention.
Figure 2:
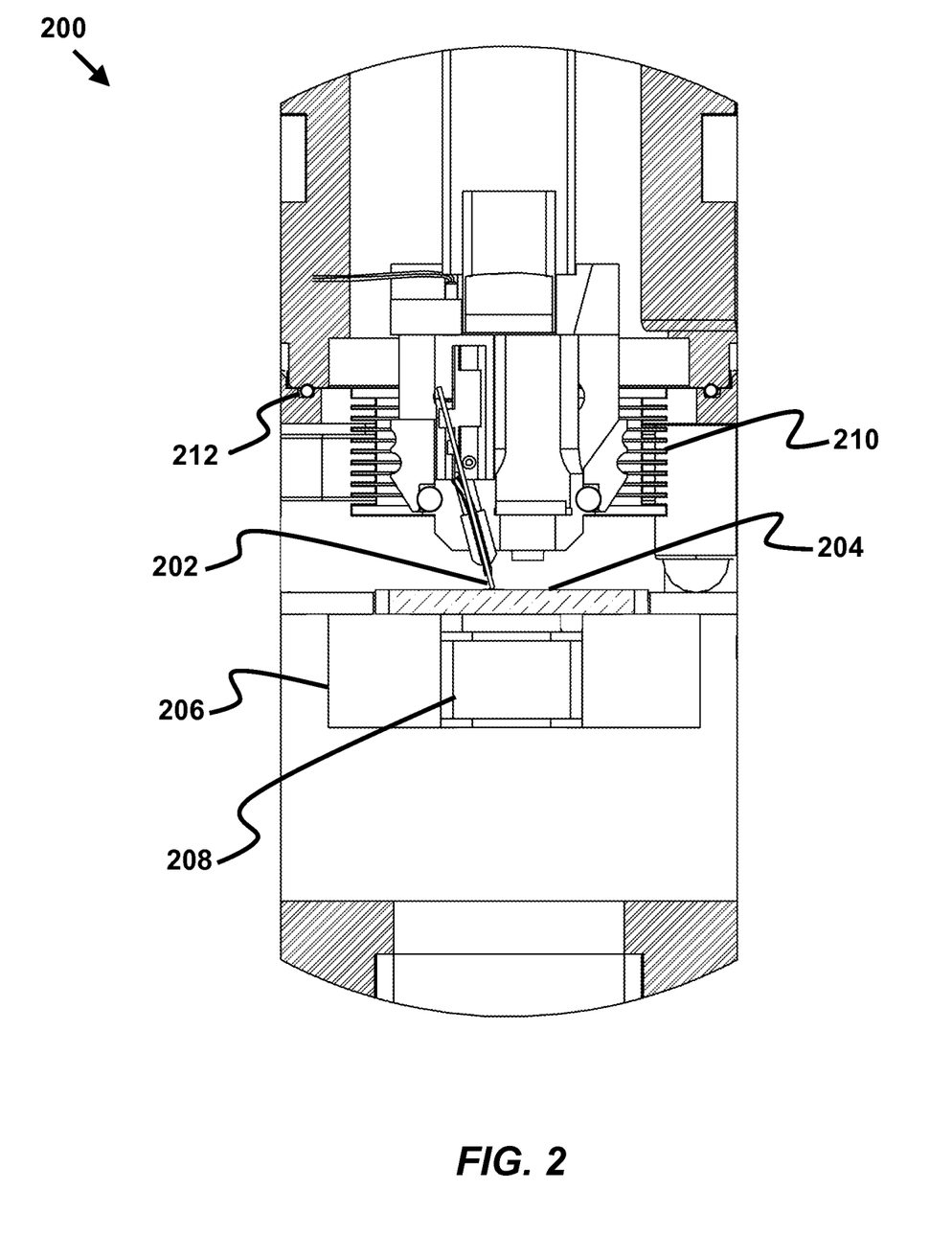
FIG. 2 shows an enlarged planar cutaway view of an SPM probe tip/sample interface of an integrated nanostructure growth apparatus according to the present invention.

FIGS. 1 and 2 show planar cutaway views of a localized nanostructure growth apparatus 100, where FIG. 2 is a planar isolated close up view of the ALD and SPM interface 200. As shown in FIG. 1 the localized nanostructure growth apparatus 100 has a partitioned chamber 102, where a first partition 104 includes a scanning probe microscope (SPM) 106 and a second partition 108 includes an atomic layer deposition (ALD) chamber 110, where the first partition 104 is hermetically isolated from the second partition 108, and at least one SPM probe tip 202 of the SPM 106 is disposed proximal to a sample 204 (see FIG. 2) in the ALD chamber 110. The partition ensures that contaminants in the ALD chamber 110 can be kept to a relatively low level, and prevent precursor vapor from damaging critical microscope components. According to one aspect of the invention, an electrical bias exists between the SPM probe tip 202 and the sample 204, where the probe tip 202 may be grounded or charged, and conversely the sample 204 may be charged or grounded. It is understood that the SPM 106 can include atomic force microscope or scanning tunneling microscope. According to one embodiment, the sample 204 is disposed on a moveable mount.

Figure 4A:
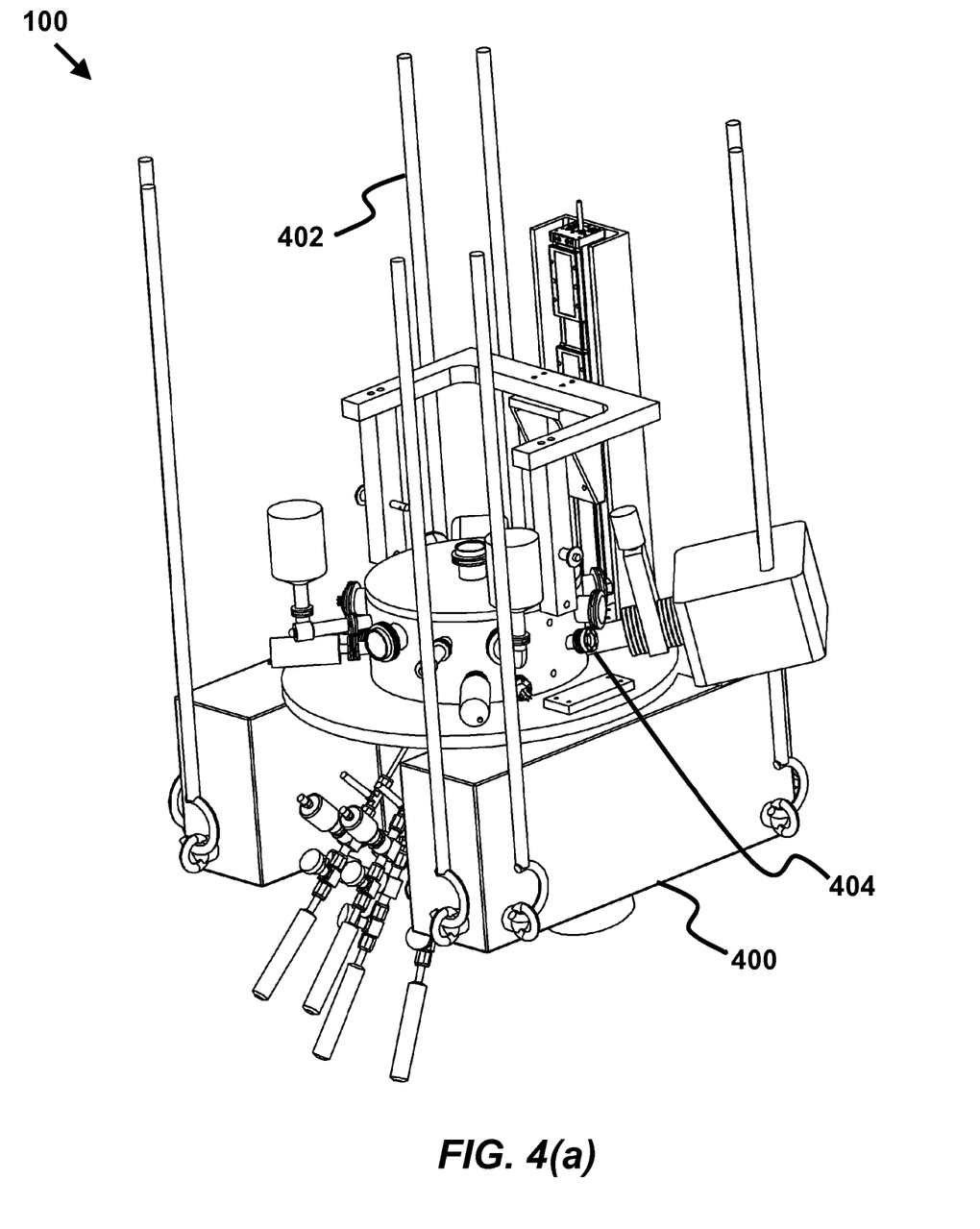
FIGS. 4(a)-(b) show a top perspective view and a bottom perspective view, respectively of an enlarged planar cutaway view of an integrated nanostructure growth apparatus according to the present invention.

FIG. 1 further shows the nanostructure growth apparatus 100 includes at least one in-situ optical measurement path 118 to a SPM probe tip-sample interface, where the sample 204 is disposed on the substrate having a transparency in a range of 200 nm to 2500 nm. Though this exemplary optical measurement path 118 is disposed from the bottom of the nanostructure growth apparatus 100, it is understood that optical measurement paths 118 are from other directions are possible, where FIG. 4(a) shows an alternative path which uses viewport 404. The exemplary optical path 118 requires a transparent substrate and for a line-of-sight 208 to be preserved through the center of the sample stage and heater 206. The advantages of this configuration are numerous. The tip 202 does not have a shadowing effect, eliminating any concerns over the deposited patterns not being illuminated. In addition, the incident light is normal to the substrate surface. Should the light be other than normal, the projected area illuminated by the light would be larger than the normal cross-section, resulting in a decrease in power density. With the scanner geometry of the SPM 106 as shown, the light would be incident at 80° from the vertical, resulting in an 83% reduction in power density. However, with the incident light normal to the surface, there is no such decrease. Furthermore, the external alignment and routing of the light is greatly simplified by illumination from below. While illuminating from above would require a 10° grazing angle, necessitating precise alignment in both angle and position, illuminating from below with a vertical beam requires less precise alignment. Manipulation of a final mirror can be done simply with a two-axis translational stage, with no rotational degrees of freedom required.

In another embodiment, light is transmitted to the chamber with a fiber-optic cable. A two-axis positioner and a lens are required to align and focus the light on the SPM probe tip-sample interface.

To utilize the optical path from below, transparent samples are required. A modified freestanding ultra-thin membrane produces useful windows. An exemplary window membrane is composed of 100 nm of silicon nitride, with 50 nm of gold as the back electrode is provided. Since the membrane is very thin, a significant amount of the light is transmitted.

In another embodiment, the optical light path delivers light to the sample from above. This enables the use of non-transparent substrates.

In one embodiment, a broad-spectrum light source, such as a Xe arc lamp, is used to provide light at a wide range of wavelengths, and a monochromator may be used to select a narrower range of wavelengths for further characterization. An exemplary Xe arc lamp has a color temperature of 5800 K, a power of 75 W, and a spectral range of 200-2500 nm. A mirror and lens are positioned by a simple two-axis translating stage. In this configuration the STM tip is used to fabricate the deposited structure, and then immediately characterize it. This in-situ characterization has the advantage of evaluating the photoresponse of the structure as-fabricated, without oxidation as a factor.

A localized nanostructure growth apparatus that has a partitioned chamber is attractive for several reasons. The tip-enhanced deposition and subsequent imaging can be performed in the same chamber, with no transferring of the substrate required. This allows mid-process characterization and re-indexing for greater positional accuracy, as well as eliminating oxidation concerns associated with sample transfer. Since ALD requires only a roughing vacuum environment ($10^{-2}$ Torr), cost and throughput issues associated with higher vacuum levels are not limiting factors. Finally, the additive nature of SPM-enhanced ALD allows for a wide range of materials to be built up, atomic layer by atomic layer.

As shown in FIG. 2, the SPM 106 accesses the ALD chamber 108 through a gas impermeable barrier 210 disposed between the chamber partitions 104/108. Here, the barrier 210 is shown as an extendable gas impermeable bellows barrier. The sealing between the chambers is further facilitated by at least one O-ring 212.

The ALD chamber 110 further includes a localized sample heater 206 (see FIG. 2), at least one precursor inlet port 112 and at least one precursor outlet port 114. Here, the localized heating stage 206 is disposed to locally heat the sample 204 to a temperature that is independent of the ALD chamber, where a chemical reaction is localized on the sample 204. According to one embodiment, the ALD chamber 108 includes a pump (not shown) that is free of moving parts.

While heating the entire vacuum chamber, as is typically done in standard ALD, would be effective in addressing any condensation problem, the integration of the SPM 106 with an ALD 110 presented significant challenges. Piezoelectric elements (not shown) in the SPM 106 are extremely sensitive components, as they lose power at elevated temperatures and ultimately lose polarization at the material's Curie point. A limitation on the scanner temperature of 60° C. is known.

A conventional heater in a vacuum environment possesses wiring limitations, as inappropriate insulation can disintegrate and introduce contamination. Subsequently, the heater's performance typically degrades. Thus, in one embodiment, a standard SPM sample heater is used, but with the resistance wire insulation modified to a vacuum-compatible material.

According to the current invention, the nanostructure growth apparatus 100 further includes a network analyzer (not shown) disposed to provide dielectric imaging, capacitive tip height sensing and electric pulses to the SPM probe tip 202. Additionally, the nanostructure growth apparatus 100 includes a controller (not shown) that controls operations such as operating valves to commute ALD precursors to or from the ALD chamber 108, establishing the state of a valve located between the ALD chamber 108 and the vacuum pump (not shown), which either allows the vacuum pump (not shown) to evacuate the ALD chamber 108 or isolates the vacuum pump (not shown), positioning of the SPM probe tip 202, providing electrical bias or grounding of the SPM probe tip 202, providing electrical bias or grounding of the sample 204, controlling temperatures of the ALD precursor supply lines 116, or controlling purge gas flow rates. The invention further includes precursor metering (not shown) disposed to ensure that the pressure of the precursor gas as it enters the ALD chamber 108 is less than the unmodified vapor pressure of the precursor. According to one embodiment, the ALD chamber 108 includes at least one injection needle (not shown) disposed to inject precursor gases directly to a location of a SPM probe tip-sample interface.

In another embodiment, the nanostructure growth apparatus 100 further includes a function generator, pulse generator, or other devices which generate voltage waveforms, current waveforms and/or pulses, (not shown) that provides pre-defined voltage pulses to the SPM probe tip 202, where the voltage pulses have a duration and magnitude to control charge transfer on the sample 204. According to the invention, software is provided facilitating the deposition and patterning process control for the SPM-ALD station. The software simultaneously controls multiple temperature controllers, each of which controls one temperature on the SPM-ALD station. Additional features include the capability to linearly ramp the temperature on any controller as well as the ability to automatically tune the control gains of each controller to more quickly and accurately achieve the desired temperature set points. Multiple precursor/oxidant materials can be used in specifying the process and the system can easily be expanded with additional ones.

The process sequence is controlled via a simple tabular format and includes the capability of controlling system temperatures, controlling carrier gas flow rates, monitoring multiple system pressures as well as an additional system voltage output, controlling exposure mode ALD, as well as a number of other advanced features that allow great flexibility in designing a process sequence. The invention enables many complex deposition sequences such as multiple material deposition, non-stoichiometric deposition, thin film with a material gradient deposition, and exposure mode ALD deposition.

The invention further includes scripting to pattern complex structures and to aid repeatability. With this capability, a single script can control opening and closing of precursor valves and the stop valve, power to the vacuum pump, as well as exercise significant control over the SPM operation. Positioning of the tip 202, scan speed and direction, and tip 202 and sample bias can all be controlled through a script. These capabilities and others allow complex sequences to be performed in an integrated fashion.

An exemplary script commands the following sequence of events. First the SPM tip position, and scan area and speed would be set. The water valve would be pulsed, introducing water vapor into the deposition chamber to hydroxylize the surface, and excess water vapor would be pumped out. The SPM tip would start scanning, and the precursor valve would be pulsed, introducing precursor vapor into the chamber. The tip bias would be set to the desired value, and the tip would scan over the preset area. After a predetermined time, the tip bias would be set to zero, and the tip would stop scanning The excess precursor vapor would be pumped from the chamber, and the tip would move to the next location and repeat the process. All of this is done automatically by commanding a single script to start.

In one embodiment, the scripting is implemented as follows. Scripts run in Matlab provided the top-level sequence command. These Matlab scripts were then interfaced with a SPM software, PicoView 1.4, and National Instruments' instrumentation software, LabVIEW 8.5, with interface packages provided by the respective companies.

An important feature of the SPM-ALD process control software is the capability of monitoring a generic system voltage and plotting a time history of its value. This enables precise measurements of the electrical current flowing through the sample and AFM tip during AFM patterning experiments, for example. The current-data is valuable in understanding the underlying physics of the deposition mechanisms occurring in nanoscale patterning processes.

Figure 3:
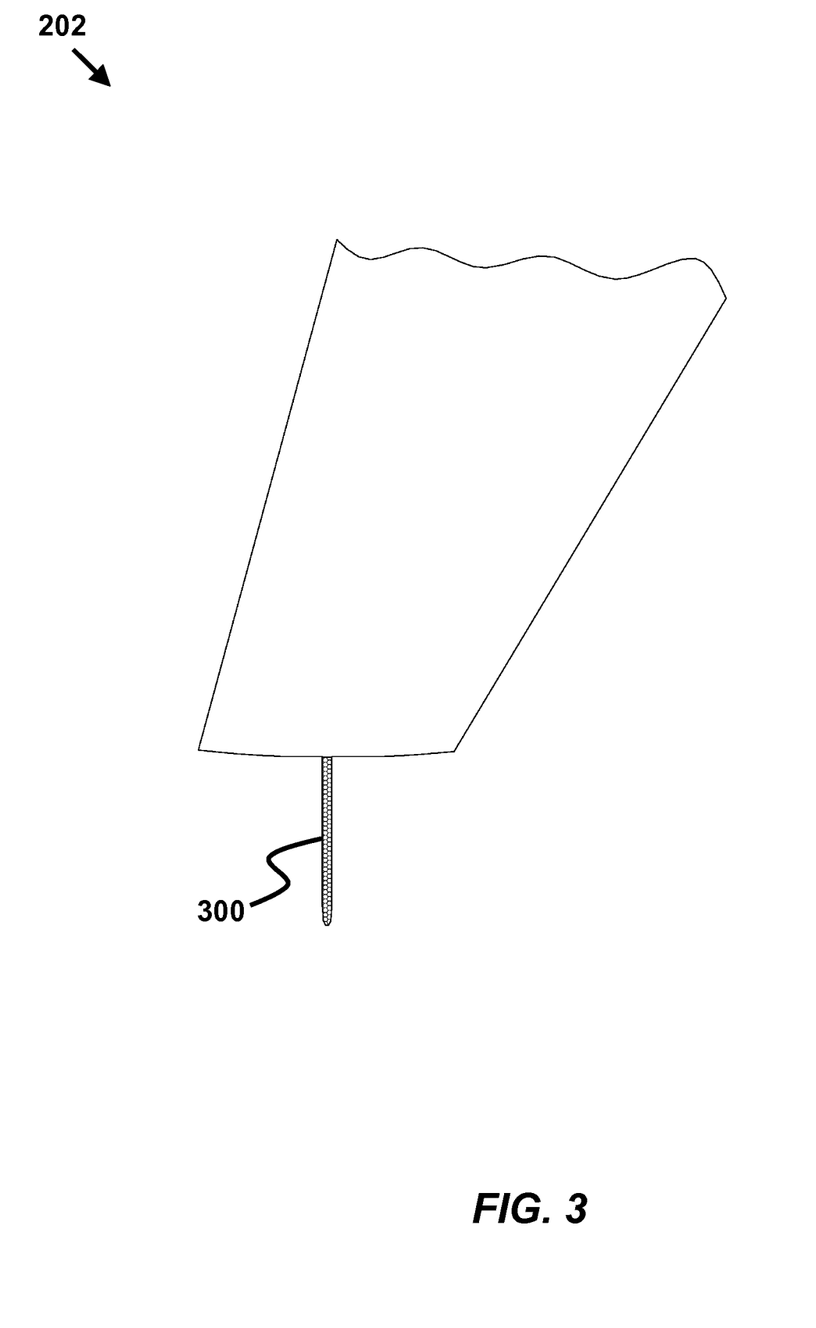
FIG. 3 shows planar cutaway view of a SPM probe tip having a nanowire according to the present invention.

As shown in FIG. 3, the SPM probe tip 202 has at least one wire 300 disposed on the SPM probe tip 202, where the wire 300 has a diameter up to 200 nm.

In another aspect, SPM probe tip can be a linear array (not shown) of the SPM probe tips 202, wherein the linear array is disposed on a single cantilever. Here, the invention further includes at least one switch (not shown) disposed to address one probe tip 202, where tip-enhanced ALD deposition and imaging is provided on the sample 204 in the ALD chamber 108. In one embodiment, the probe tip 202 includes a catalyst coating. In a further embodiment, the probe tip 202 has a ceramic insulating film. In another embodiment, the SPM probe tip 202 includes a conductive metal layer disposed between two insulating layers. In a further embodiment, the SPM tip 202 is disposed to remove at least one ligand by charge transfer, where the ligand is removed from a precursor that has been deposited by the ALD process. In another embodiment, the SPM probe tip 202 can be disposed to affect the rate of an ALD reaction of at least one site that is proximal to the tip 202.

Figure 4B:
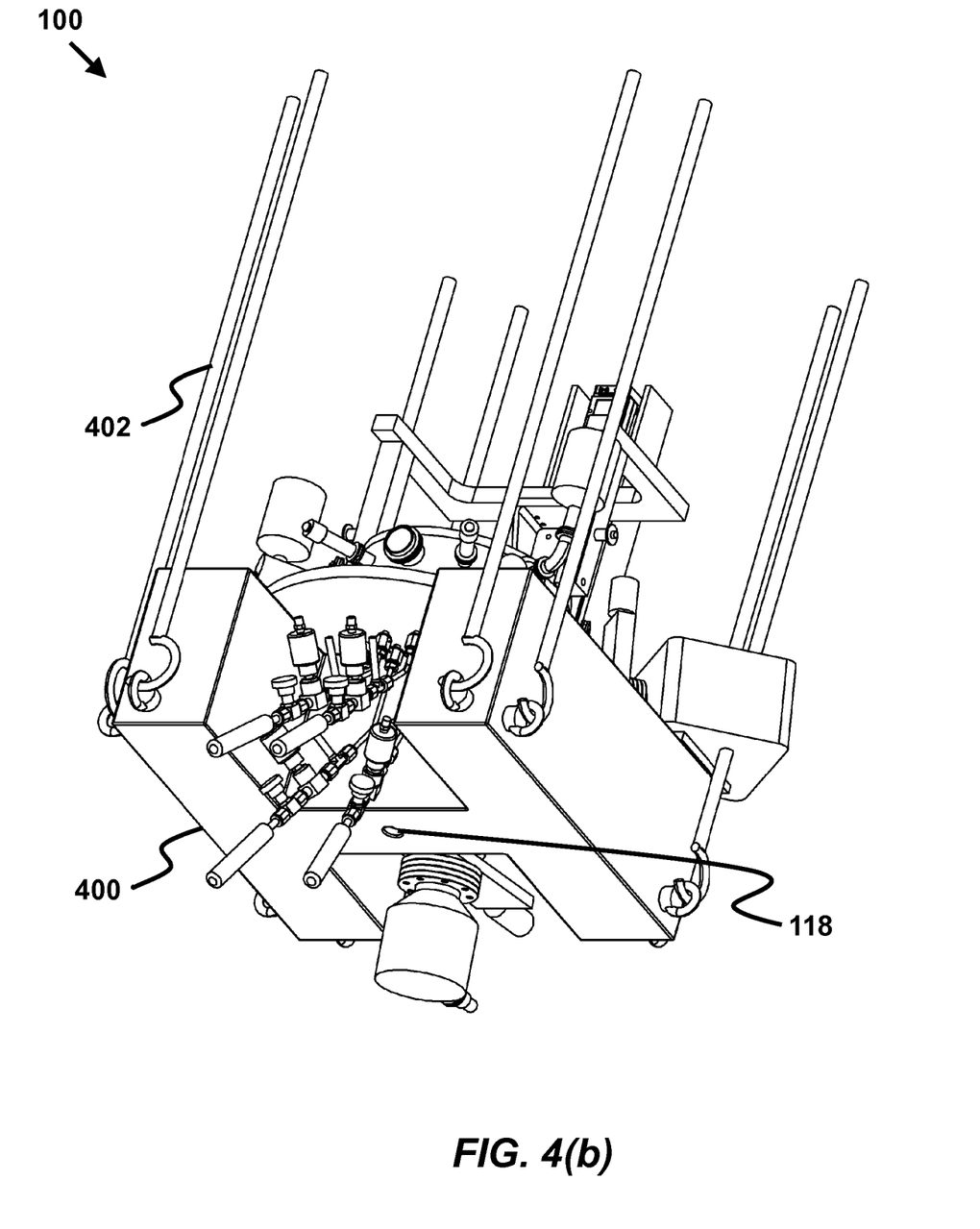

Referring to FIGS. 4(a) and 4(b), which show a top perspective view and a bottom perspective view, respectively, of the localized nanostructure growth apparatus 100, the ALD chamber 108 is mounted a vibration damping structure, such as a granite block 400 suspended by elastic cords 402. The ALD chamber 108 and vibration damping structure 400 and 402 are mounted inside an acoustic isolation chamber (not shown). The top perspective view of FIG. 4(a), further shows an optical window 404 for an alternate optical path for viewing/monitoring the SPM probe tip-sample interface. According to one embodiment, a fiber optic aligner may be mounted to the window 404.

The present invention has now been described in accordance with several exemplary embodiments, which are intended to be illustrative in all aspects, rather than restrictive. Thus, the present invention is capable of many variations in detailed implementation, which may be derived from the description contained herein by a person of ordinary skill in the art. For example, a load lock system which enables samples to be loaded without venting the ALD chamber 108 to atmospheric pressure, the vibration damping system may comprise a pneumatically suspended table, a radio-frequency-interference isolation system such as a Faraday cage may be used.

All such variations are considered to be within the scope and spirit of the present invention as defined by the following claims and their legal equivalents.

What is claimed is:

1. A scanning probe microscope (SPM) isolation device, comprising a chamber divided into two partitions, wherein a first partition comprises a SPM located above a second partition, wherein piezoelectric elements of said SPM are located in said first partition, wherein said first partition is hermetically isolated from said second partition, wherein a SPM probe tip of said SPM is disposed in said second partition, wherein a remaining portion of said SPM is disposed in said first partition that is hermetically isolated from said second partition, wherein said SPM accesses said second partition through a gas impermeable barrier disposed between said partitions.

2. The SPM isolation device of claim 1, wherein said SPM comprises an atomic force microscope or a scanning tunneling microscope.

3. The SPM isolation device of claim 1, wherein a network analyzer is disposed to provide dielectric imaging and capacitive tip height sensing to the SPM probe tip.

4. The SPM isolation device of claim 1, wherein said SPM probe tip comprises a wire disposed on said SPM probe tip, wherein said wire has a diameter up to 200 nm.

5. The SPM isolation device of claim 1, wherein said SPM probe tip comprises a linear array of said SPM probe tips, wherein said linear array is disposed on a single cantilever.

6. The SPM isolation device of claim 5 further comprises a switch disposed to address one of said probe tips in said array.

7. The SPM isolation device of claim 1, wherein said probe tip comprises a catalyst coating.

8. The SPM isolation device of claim 1, wherein said probe tip comprises a ceramic insulating film.

9. The SPM isolation device of claim 1, wherein said SPM isolation device is mounted in an acoustic isolation structure.

10. The SPM isolation device of claim 1, wherein said SPM isolation device is mounted on a vibration damping structure.

11. The SPM isolation device of claim 1, wherein said SPM isolation device comprises a pump that is free of moving parts.

12. The SPM isolation device of claim 1, wherein said SPM isolation device comprises a function generator, a pulse generator, or another device which generates voltage waveforms and pulses that provides predefined voltage pulses to said SPM probe tip.

13. The SPM isolation device of claim 1, wherein said SPM probe tip comprises a conductive metal layer disposed between two insulating layers.

14. The SPM isolation device of claim 1 further comprises an in-situ optical measurement path to said SPM probe tip.

* * * * *

UNITED STATES PATENT AND TRADEMARK OFFICE
CERTIFICATE OF CORRECTION

| | | |
|---|---|---|
| PATENT NO. | : 8,499,361 B2 | Page 1 of 1 |
| APPLICATION NO. | : 13/548845 | |
| DATED | : July 30, 2013 | |
| INVENTOR(S) | : James F. Mack | |

It is certified that error appears in the above-identified patent and that said Letters Patent is hereby corrected as shown below:

On the title page, item 75 a data entry error has occurred resulting in the misspelling of an inventor's name. Andrei Iancu is the correct spelling, where the data entry error shows the inventors first name ending with the letter l instead of the letter i.

Signed and Sealed this
Eighteenth Day of February, 2014

Michelle K. Lee
*Deputy Director of the United States Patent and Trademark Office*